United States Patent [19]

Hanmura

[11] Patent Number: 4,616,175
[45] Date of Patent: Oct. 7, 1986

[54] WAVEFORM OBSERVATION APPARATUS
[75] Inventor: Hisao Hanmura, Kumagaya, Japan
[73] Assignee: Shin-Kobe Electric Machinery Co., Ltd., Tokyo, Japan
[21] Appl. No.: 572,944
[22] Filed: Jan. 23, 1984
[30] Foreign Application Priority Data Jan. 24, 1983 [JP] Japan .................................. 58-9601

[51] Int. Cl.$^4$ .......................... G01R 13/00; G01R 1/00
[52] U.S. Cl. ................................. 324/121 R; 324/111; 324/157
[58] Field of Search ................... 324/121 R, 157, 111, 324/112; 346/7, 30; 369/50; 360/137; 364/487; 323/349–351; 179/6.14; 365/227

[56] References Cited
U.S. PATENT DOCUMENTS 3,599,222 8/1971 Franklin et al. ........................ 346/7
4,120,009 10/1978 Iwasawa .............................. 360/137

Primary Examiner—Ernest F. Karlsen
Attorney, Agent, or Firm—Pearne, Gordon, Sessions, McCoy, Granger & Tilberry

[57] ABSTRACT

This invention relates to a waveform observation apparatus such as an oscilloscope, and more particularly to a waveform observation apparatus suitable for a liquid crystal oscilloscope having a liquid crystal display of low power consumption.

The waveform observation apparatus comprises at least a waveform memory in which a waveform data is to be written, an input circuit to control the waveform memory to write the waveform data therein and a power supply circuit to drive the waveform memory and the input circuit. The power supply circuit includes means to only intermittently apply the power supply voltage for at least part of the input circuit for a time necessary for writing a waveform. This causes the power consumption to be lowered.

7 Claims, 2 Drawing Figures

WAVEFORM OBSERVATION APPARATUS

BACKGROUND OF THE INVENTION

A liquid crystal oscilloscope has a liquid crystal display which is adapted to have low power consumption. However, since the oscilloscope has an amplifier and an analog-to-digital converter in an input circuit, both of which have higher power consumption, storage batteries cannot be advantageously used for a substantially long time.

SUMMARY OF THE INVENTION

Accordingly, it is a principal object of the invention to provide a waveform observation apparatus in which power consumption is relatively lower so that storage batteries can be used for a longer time.

In accordance with the invention, there is provided a waveform observation apparatus comprising at least a waveform memory in which waveform data is to be written, an input circuit to control said waveform memory to be operated so as to write said waveform data therein and a power supply circuit to drive said waveform memory and said input circuit, characterized in that said power supply circuit includes means to intermittently energize at least part of said input circuit from the power supply for a time necessary for writing said waveform data.

BRIEF DESCRIPTION OF THE DRAWING

The above and other objects and features of the invention will be apparent from the description of the embodiment taken with the accompanying drawing in which.

DETAILED DESCRIPTION OF THE EMBODIMENT

Figure 1:
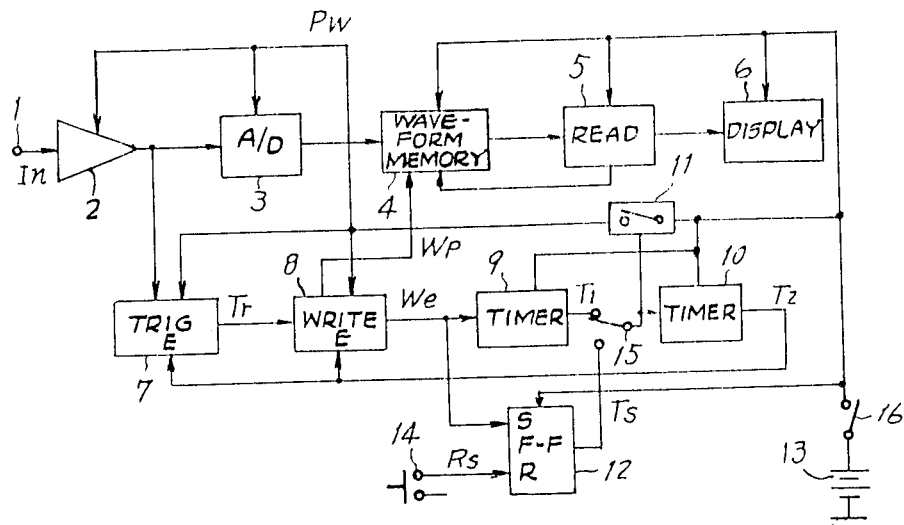
FIG. 1 is a schematic diagram of a waveform observation apparatus of the invention.
Figure 2:
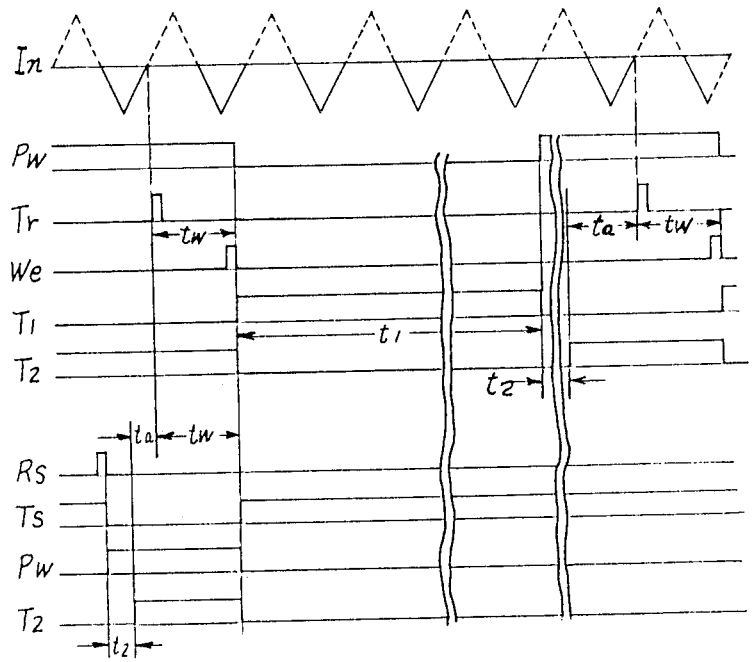
FIG. 2 illustrates waveforms at various portions of the apparatus.

Referring now to FIG. 1, an input signal In applied to an input terminal 1 is amplified by an input amplifier 2 and then supplied to a trigger circuit 7 and also to an analog-to-digital converter 3. The trigger circuit 7 produces a trigger signal Tr when an output of the input amplifier 2 meets a predetermined condition. In FIG. 2, the trigger signal Tr is shown to be produced at the centers of positive slopes of the input signal In.

The analog-to-digital converter 3 converts the output signal from the input amplifier 2 into a digital signal to supply it to a waveform memory 4. A writing circuit 8 supplies a writing pulse Wp to the waveform memory 4 when the writing circuit 8 receives the trigger signal Tr, to control the waveform memory in which a frame of digital signal supplied from the analog-to-digital converter 3 is written. The writing circuit 8 produces a writing termination pulse We after it finishes producing the writing pulse for one frame. The writing termination pulses We are supplied to a timer 9 and also to a flip-flop 12. A writing time tw for one frame is proportional to a period of the waveform to be observed and is about 1 ms for the 1000 Hz waveform.

A mode change-over switch 15 selects one of two modes, a repeated mode in which the waveform is repeatedly and continuously observed, and a single sweep mode in which a single waveform is observed only once.

At first, the repeated mode in which the mode change-over switch 15 is connected to the output holding signal T1 of the timer 9 will be described. The timer 9 produces a holding signal T1 for a time t1 after it receives the writing termination pulse We, which is shown in FIG. 2. The time t1 which corresponds to a pulse width of the holding signal T1 is about 500 ms, and is shown considerably shortened in FIG. 2. The holding signal T1 is supplied through the mode change-over switch 15 to a timer 10. The timer 10 produces a writing permission signal T2 while there is no holding signal T1 as shown in FIG. 2, but the writing permission signal T2 raises up at a delay time of t2 which is about 50 ms. The writing permission signal T2 is supplied to the trigger circuit 7 and also to the writing circuit 8. The trigger circuit 7 and the writing circuit 8 are enabled only while the writing permission signal T2 is produced.

A switch 11 may be an electronic switch such as a transistor. The switch 11 receives the holding signal T1 as a control signal and is opened while there is the holding signal T1 so that a power supply voltage Pw for an input circuit including the input amplifier 2, the analog-to-digital converter 3, the trigger circuit 7 and the writing circuit 8 is not energized.

More particularly, when the writing operation of one frame terminates at the time tw, the holding time t1 of 500 ms begins. The power supply voltage Pw is off for the holding time tw to save the electric power. After the holding time tw elapses, the power supply voltage is again on, but it should be noted that triggering and writing are prohibited for the time t2 of 50 ms which is necessary for stabilizing the input circuit. Thereafter, when the triggering signal Tr is produced from the trigger circuit 7, the writing operation is made and the same operation is repeated. In FIG. 2, the time ta corresponds to the time in which the triggering signal Tr is produced from the trigger circuit 7 after the writing operation is permitted. The time ta is within one period of the input signal In.

Thus, it will be noted that the input circuit is powered only for about 50 ms among about 550 ms, which causes much electric power to be saved. In a conventional oscilloscope utilizing a cathode-ray tube, electron beams will move following the input waveform. Thus, in case of the input signal In of 1000 Hz, for example, 1000 frames per second are indicated on the cathode-ray tube. However, since a person's brain cannot recognize 1000 frames per second, it will be fully satisfactory for only one frame per 500 ms to be written in the waveform memory as in the liquid crystal oscilloscope of the invention.

Next, the single sweep mode in which the transient phenomenon is observed will be described. In FIG. 1, the mode change-over switch 15 is switched so as to be connected to the flip-flop 12 which produces a holding signal Ts. The operating waveforms different from those for the repeated mode are shown in FIG. 2 at the lower portions thereof. In the single sweep mode, a reset push switch 14 is closed to prepare for the measurement. At this time, the output holding signal Ts from the flip-flop 12 is reset and supplied through the mode change-over switch 15 to the switch 11. As a result, the power supply voltage Pw for the input circuit is on. After the time t2 elapses, the writing permission signal T2 is produced from the timer 10 to complete the preparation for the measurement. Thereafter, when the input signal is meeting the triggering conditions (that is when the time ta elapses), the triggering signal Tr is produced from the trigger circuit 7. Then, one frame will be written in the waveform memory 4 at the time tw. At that time, since the flip-flop 12 is set by the writing termination signal We to produce the holding signal Ts, the writing operation is prohibited later on and the power supply Pw is off. In the single sweep mode, the holding condition continues until the reset push switch 14 is again closed. Thus, it will be noted that the power saving rate is larger than that in the repeated mode.

A reading circuit 5 controls reading the data written in the waveform memory 4 and supplies the read data to a liquid crystal display 6 to indicate the waveform. The waveform memory 4, the reading circuit 5, the liquid crystal display 6, the timers 9 and 10 and the flip-flop 12 are connected through a power switch 16 to a storage battery 13, while the other circuits are connected through the electronic switch 11 and through the power switch 16 to the storage battery 13. Since the former circuits have power consumption lower than the other circuits, although the other cicruits are connected directly to the storage battery, power saving can be fully effected.

While one preferred embodiment of the invention has been described and illustrated with reference to the accompanying drawing, it will be understood by those skilled in the art that it is by way of example, and that various changes and modifications may be made without departing from the spirit and scope of the invention. For example, the display 16 may be of plasma or of cathode-ray tube. Furthermore, this invention may be applied to a logicscope in which a digital input signal is directly stored and indicated other than the oscilloscope in which the analog input signal is converted into the digital signal to be stored. Also, the reading circuit 5 and the display 6 may be omitted. Thus, the invention is intended to be defined only to by the appended claims.

What is claimed is:

1. A waveform observation apparatus comprising at least a waveform memory in which waveform data is to be written, an input circuit adapted to receive waveform data and connected to control said waveform memory to write said waveform data therein, and a power supply circuit to supply operating voltage to said waveform memory and said input circuit, characterized in that said power supply circuit includes means to intermittently energize at least part of said input circuit from the power supply for a time necessary for writing said waveform data, and said intermittent means establishing said at least part of said input circuit deenergized for a time longer than said energization time even though waveform data is being received.

2. A waveform observation apparatus as set forth in claim 1, wherein said input circuit comprises at least a trigger circuit to produce a triggering signal when an input signal to said input circuit meets a predetermined condition, and a writing circuit connected to said waveform memory to produce a writing signal to write said waveform data in said waveform memory when said triggering signal is produced and to produce a writing termination signal when the writing terminates.

3. A waveform observation apparatus as set forth in claim 2, wherein said power supply circuit comprises at least a first timer to produce a holding signal for a predetermined time after said writing termination signal is produced and said intermittent means includes a switch to turn off the power supply for said input circuit while said holding signal is produced.

4. A waveform observation apparatus as set forth in claim 2, wherein said power supply circuit comprises at least a first timer to produce a holding signal for a predetermined time after said writing termination signal is produced, said intermittent means includes a switch to turn off the power supply for said input circuit while said holding signal is produced and a second timer to permit the writing operation when a predetermined time elapses after said holding signal stops.

5. A waveform observation apparatus as set forth in claim 1, and further comprising a reading circuit connected to said waveform memory and a display connected to said reading circuit whereby said waveform data written in said waveform memory can be indicated.

6. A waveform observation apparatus as set forth in claim 5, wherein said display is of liquid crystal type.

7. A waveform observation apparatus as set forth in claim 1, including change-over means to change between a single sweep mode and a repeated sweep mode.

* * * * *